United States Patent [19]
Cornett et al.

[11] Patent Number: 5,959,515
[45] Date of Patent: Sep. 28, 1999

[54] HIGH Q INTEGRATED RESONATOR STRUCTURE

[75] Inventors: Kenneth D. Cornett, Coral Springs; Branko Avanic, Miami, both of Fla.; David L. Stolfa, Phoenix, Ariz.

[73] Assignee: Motorola, Inc., Schaumburg, Ill.

[21] Appl. No.: 08/909,206

[22] Filed: Aug. 11, 1997

[51] Int. Cl.⁶ ....................................................... H03J 3/20
[52] U.S. Cl. ................................. 334/14; 333/185; 334/45
[58] Field of Search ................................... 334/14, 15, 45; 333/185; 336/200, 232; 257/531

[56] References Cited

U.S. PATENT DOCUMENTS

| | | | |
|---|---|---|---|
| 3,585,535 | 6/1971 | Senf | 333/161 |
| 5,173,835 | 12/1992 | Cornett et al. | 257/310 |
| 5,430,895 | 7/1995 | Huusko | 333/185 X |
| 5,844,451 | 12/1998 | Murphy | 333/185 |

*Primary Examiner*—Paul Gensler
*Attorney, Agent, or Firm*—Frank M. Scutch

[57] ABSTRACT

A high Q integrated inductor-capacitor (L-C) resonator (200) includes a planar inductor (201) having a plurality of turns and a serially connected first and second capacitor (205, 207) that is connected in parallel with the planar inductor (201). The first and second capacitors (205, 207) are positioned within at least one turn of the planar inductor (201) for reducing the parasitic interconnection resistance between the planar inductor (201) and first and second capacitor (205, 207) and also increasing the Q factor of the L-C resonator.

10 Claims, 2 Drawing Sheets

HIGH Q INTEGRATED RESONATOR STRUCTURE

TECHNICAL FIELD

This invention relates in general to a resonator and more specifically tunable L-C tank resonator.

BACKGROUND

Integrated inductor/capacitor (L-C) circuits are well known in the art. L-C circuits are most often provided for use in high frequency oscillators or filter circuits acting to provide a high quality factor or "Q" for initiating oscillation or feedback.

An integrated L-C tank circuit, such as used with an integrated voltage controlled oscillatory (VCO) is most often formed using a thin film inductor in parallel with a series combination of an metal-insulator-metal (MIM) capacitor and either a voltage dependent metal oxide semiconductor (MOS) capacitor, varactor diode or voltage variable capacitor using a high K dielectric. This is best described in U.S. Pat. No. 5,173,835 herein incorporated by reference. These three components are designed and connect in a way to minimize parasitic interconnection resistance with the tank circuit, providing a substantially high Q resonator.

There is currently an emerging presence of integrated inductors with a high Q in the 1 Gigahertz (Ghz) frequency range and higher. These inductors typically have a Q of 15 to 30 and are integrated on the chip or integrated circuit (IC). It has recently been noted that a thin film spiral inductor consisting of several turns of line loosely wrapped about an open center area provides a higher Q than a comparable value inductor consisting of several turns tightly wrapped about a center. In both structures, a cross-under or cross-over metalization is required to connect the inner turn of the inductor to an outside connection. Because the cross-under metal is thin layer, aluminum alloy is often used in the integrated circuit (IC) fabrication process as compared with a thicker plated copper film which is preferred for the inductor. As can be recognized, this adds a significant resistance that negatively impacts the Q of the circuit. Thus, one reason for the higher performance of an "open" style inductor is that the cross-under required is shorter since it crosses under the inductor with fewer turns.

As seen in prior art FIG. 1 is a schematic diagram of a typical L-C resonator 10 illustrates an inductor 11 in parallel with a combination of a fixed capacitor 13 and voltage variable capacitor 15 forming a resonator. Resistors 17, 19 and 21 are used to control bias voltages in the resonator 10. It will be evident to those skilled in the art that depending on the parallel circuit connection between the inductor 11 and capacitors 13, 15, a cross-over resistance will be created that is located substantially within the tank i.e. the between the inductor capacitor parallel combination.

Thus, it is often necessary to place components in a manner to provide space and Q efficiency. To maximize the Q of the tunable varactor (VVC) element and that of double-poly fixed value capacitors (DPC) used as components in the resonator, an interdigitated finger structure can be employed in order to reduce the resistance of contacting the semiconductor material that includes the capacitor's bottom electrode. The desirable length of fingers would be similar to the length of the cross-under runner needed for a typical open center inductor. However, unless the fingers are positioned in the correct way, cross under resistance will be high, and negatively impact the operation of the resonator.

Therefore, the need exists for a resonator architecture structure that is space and loss efficient by effectively eliminating cross-under and parasitic interconnection resistance from the resonator by selectively positioning components in a predetermined fashion.

DETAILED DESCRIPTION OF THE PREFERRED EMBODIMENT

Figure 2:
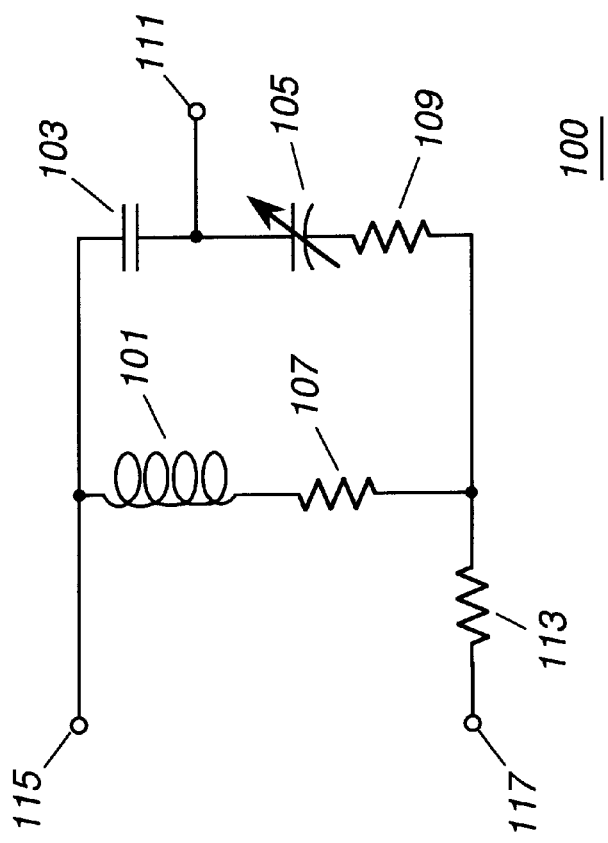
FIG. 2 is a schematic diagram showing a high Q L-C tank resonator wherein the cross-under resistance has been moved in accordance with the preferred embodiment of the present invention.
Figure 1:
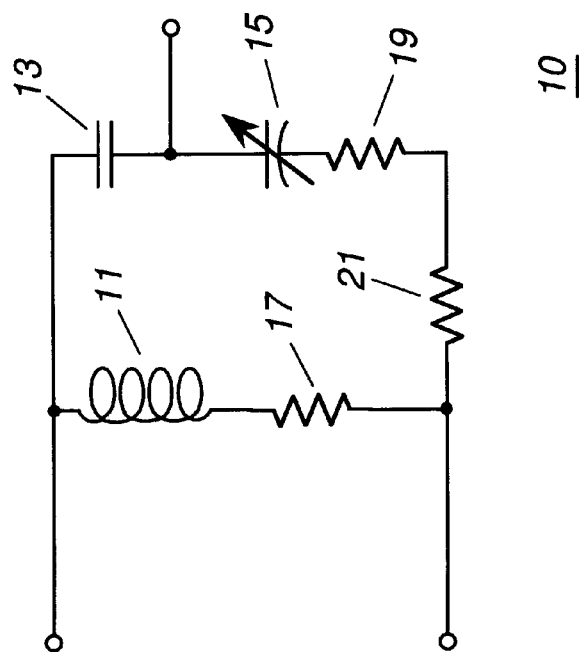
FIG. 1 is a prior art schematic diagram of a standard L-C tank circuit.

Referring now to FIG. 2, a schematic diagram illustrates a high Q inductor capacitor (L-C) tank resonator 100 including an inductor 101 connected in parallel with a fixed capacitor 103 and a variable capacitor 105. Resistors 107 and 109 are used to bias the circuit to provide resonance at a predetermined frequency. The variable capacitor 105 is typically a tunable varactor capacitor (VVC) and includes a control node 111 for supplying voltage to the VVC and controlling the capacitance thereof. As will be disclosed herein the fixed capacitor 103 and variable capacitor 105 are connected to the inductor 101 in such a way as to move the cross-under and parasitic interconnection resistance 113 to a position outside or remote from the tank resonator 100. It will be evident to those skilled in the art that although two capacitors are used in the tank circuit, a single fixed or variable capacitor can also be used to satisfy circuit requirements.

Figure 3:
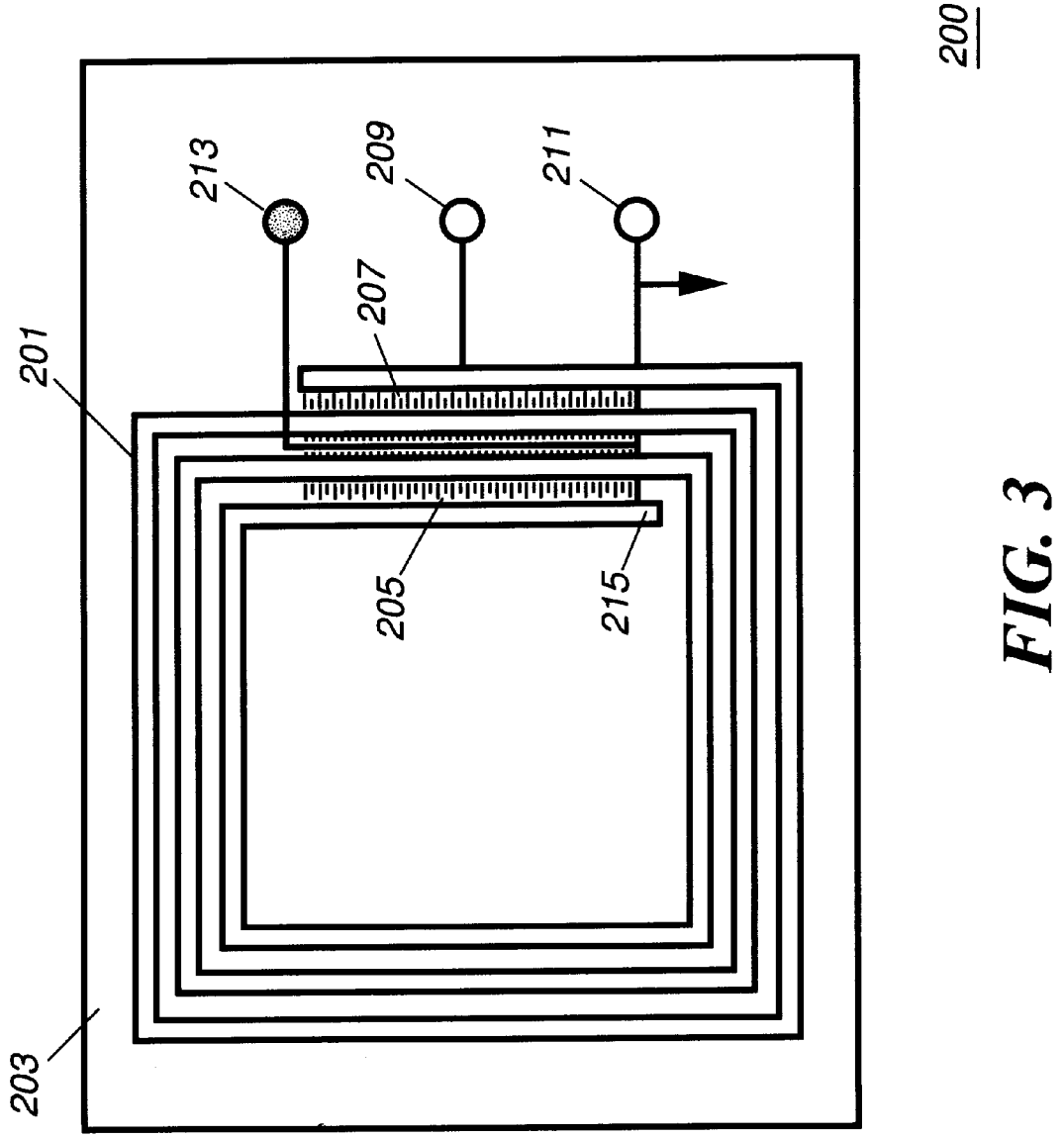
FIG. 3 is a top view of an integrated high Q L-C tank resonator.

FIG. 3 illustrates a top view of a typical integrated high Q L-C tank resonator 200 according to the preferred embodiment of the invention. The resonator 200 includes a thin film spiral inductor 201 positioned on a substrate 203 in a spiral, winding or serpentine configuration. As noted in FIG. 2, an interdigitated VVC 205 and interdigitated fixed double polysilicon capacitor (DPC) 207 are serially connected while subsequently forming a parallel connection with the inductor 201. A first runner 209 and a second runner 211 are used to connect the resonator 200 in circuit. A control node 213 is used for providing voltage to the VVC and controlling the capacitance thereof.

In order to decrease the cross-under and/or parasitic interconnection resistance between the connection between the VVC 205, fixed capacitor 207 and the inductor 201, it is advantageous to locate the combined VVC 205 and DPC 207 pair between one or more turns of the inductor 201. While there is still a cross-under runner 2111 to contact the inner turn 215 of the inductor 201, its resistance is now substantially located outside and remote from the critical L-C tank resonator. While physically located in this portion of the tank resonator 200, its effect on circuit performance is lessened, thus enhancing the Q of the resonator.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A high Q integrated inductor-capacitor (L-C) resonator comprising:

a multi-sided spiral planar inductor having a plurality of turns;

a first capacitor connected in parallel with the planar inductor; and wherein the first capacitor is positioned between adjacent turns on one of the side of the planar inductor for reducing the parasitic interconnection resistance between the planar inductor and the first capacitor and increasing the Q factor of the L-C resonator.

2. A high Q integrated L-C resonator as in claim 1 further comprising a second capacitor connected serially with the first capacitor.

3. A high Q integrated L-C resonator as in claim 2, wherein the second capacitor is an interdigitated voltage variable capacitor.

4. A high Q integrated L-C resonator as in claim 1, wherein the first capacitor is formed by a series of serially connected fixed interdigitated polysilicon capacitors.

5. A high Q integrated inductor-capacitor (L-C) resonator comprising:

at least one multi-sided planar spiral inductor formed on a substrate;

a fixed capacitor connected serially with a voltage variable capacitor; and wherein the fixed capacitor and the voltage variable capacitor are positioned between adjacent turns on one of the sides of the at least one planar spiral inductor for reducing parasitic interconnection resistance between the at least one planar spiral inductor and both the fixed capacitor and voltage variable capacitor thereby increasing the Q of the resonator.

6. A high Q interdigitated L-C resonator as in claim 5, wherein the fixed capacitor and the voltage variable capacitor are comprised of a plurality of interdigitated polysilicon elements.

7. A method for forming an integrated high Q inductor-capacitor (L-C) resonator on a substrate comprising the step of:

connecting at least one multi-sided spiral inductor having a plurality of planar turns in parallel with at least one fixed capacitor; and wherein the at least one fixed capacitor is positioned between adjacent turns on one of the sides of the at least one inductor reducing the parasitic interconnection resistance of the at least one fixed capacitor to the at least one inductor and thereby increasing the Q of the resonator.

8. A method as in claim 7, further comprising the step of connecting a variable capacitor in series with the at least one fixed capacitor.

9. A method as in claim 8, wherein the variable capacitor is a voltage variable capacitor comprised of a plurality of interdigitated elements.

10. A method as in claim 7, wherein the at least one fixed capacitor is comprised of a plurality of interdigitated serially connected polysilicon capacitors.

* * * * *